United States Patent
Lee et al.

(10) Patent No.: US 7,953,992 B2
(45) Date of Patent: May 31, 2011

(54) SYSTEM IN PACKAGE SEMICONDUCTOR DEVICE SUITABLE FOR EFFICIENT POWER MANAGEMENT AND METHOD OF MANAGING POWER OF THE SAME

(75) Inventors: Cheon-su Lee, Seoul (KR); Jin-kwon Park, Suwon-si (KR); Jae-shin Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 958 days.

(21) Appl. No.: 11/891,908

(22) Filed: Aug. 14, 2007

(65) Prior Publication Data

US 2008/0191331 A1 Aug. 14, 2008

(30) Foreign Application Priority Data

Feb. 8, 2007 (KR) .................. 10-2007-0013336

(51) Int. Cl.
*G06F 1/00* (2006.01)
*G06F 1/26* (2006.01)
*G06F 1/32* (2006.01)
*G06F 13/00* (2006.01)

(52) U.S. Cl. ........ 713/300; 713/320; 713/323; 713/324; 710/100

(58) Field of Classification Search .................. 713/300, 713/320, 323, 324
See application file for complete search history.

(56) References Cited

U.S. PATENT DOCUMENTS

| | | | |
|---|---|---|---|
| 5,388,265 A * | 2/1995 | Volk | 713/322 |
| 5,903,765 A * | 5/1999 | White et al. | 713/310 |
| 6,711,691 B1 * | 3/2004 | Howard et al. | 713/300 |
| 6,728,892 B1 * | 4/2004 | Silvkoff et al. | 713/320 |
| 6,795,926 B1 * | 9/2004 | Matula et al. | 713/300 |
| 6,968,469 B1 * | 11/2005 | Fleischmann et al. | 713/324 |
| 7,100,062 B2 * | 8/2006 | Nicholas | 713/323 |
| 7,231,533 B2 * | 6/2007 | Darmawaskita et al. | 713/323 |
| 7,376,852 B2 * | 5/2008 | Edwards | 713/323 |
| 7,454,188 B2 * | 11/2008 | Van Lammeren et al. | 455/333 |
| 7,523,331 B2 * | 4/2009 | Van Der Heijden | 713/323 |
| 2005/0052799 A1 | 3/2005 | Kim et al. | |
| 2005/0077600 A1 | 4/2005 | Kotani | |
| 2007/0073956 A1 * | 3/2007 | Goma et al. | 710/310 |
| 2007/0145986 A1 | 6/2007 | Alie | |

FOREIGN PATENT DOCUMENTS

| | | |
|---|---|---|
| JP | 2005-109086 | 4/2005 |
| KR | 10-0518593 | 4/2005 |
| KR | 10-2006-0101469 | 9/2006 |
| WO | WO2005/041007 A1 | 5/2005 |

* cited by examiner

*Primary Examiner* — Ji H Bae
(74) *Attorney, Agent, or Firm* — Mills & Onello LLP

(57) ABSTRACT

Provided are a system in package (SIP) semiconductor device suitable for efficient power management, and a method of managing power of the SIP semiconductor device. The SIP semiconductor device includes chips including first and second chips. Each of the chips includes an alive block, a local interface, and an intellectual property (IP) block. The alive block is continuously supplied with power in order to continuously be in an on-state. The local interface transmits/receives data to/from other chips. The IP block individually stores and processes data. The alive blocks of the chips are connected to each other through a first signal line unit for transmitting a signal required to wake up or initialize the chips. The alive blocks control power to the chips, respectively, in response to an external wake-up instruction signal or the signal transmitted through the first signal line unit. Therefore, power can be efficiently managed since power that is supplied to the chips of the SIP semiconductor device is managed by the alive blocks or the local interfaces of the chips.

35 Claims, 7 Drawing Sheets

SYSTEM IN PACKAGE SEMICONDUCTOR DEVICE SUITABLE FOR EFFICIENT POWER MANAGEMENT AND METHOD OF MANAGING POWER OF THE SAME

CROSS-REFERENCE TO RELATED PATENT APPLICATION

This application claims the benefit of Korean Patent Application No. 10-2007-0013336, filed on Feb. 8, 2007 in the Korean Intellectual Property Office, the contents of which are incorporated herein in their entirety by reference.

BACKGROUND OF THE INVENTION

1. Field of the Invention

The present invention relates to a system in package (SIP) semiconductor device, and a method of managing the power of the SIP semiconductor device, and more particularly, to an SIP semiconductor device that can be effectively power-managed, and a method of managing the power of the SIP semiconductor device.

2. Description of the Related Art

FIG. 1 illustrates a conventional system in package (SIP) semiconductor device 100.

Referring to FIG. 1, the conventional SIP semiconductor device 100 includes two or more chips that are packed in one semiconductor device.

For example, in the conventional SIP semiconductor device 100, a first chip 130 formed on a lower level may include memory interfaces 103 and a controller 105, and a second chip 110 formed on a higher level may include a memory as a storage unit. Hence, the second chip 110 stores data, and the first chip 130 controls the operation of the second chip 110.

The first chip 130 reads/writes data from/to the second chip 110 using the memory interfaces 103. In addition, the first chip 130 controls power-down and wake-up operations of the conventional SIP semiconductor device 100 including the second chip 110 by using the controller 105.

In the power-down mode, power is not supplied to the conventional SIP semiconductor device 100 except to components (e.g., a real time clock) performing essential operations of the conventional SIP semiconductor device 100. In the wake-up mode, the conventional SIP semiconductor device 100 is activated so as to operate. The terms "power-down mode" and "wake-up mode" are known to one of ordinary skill in the related art.

In the conventional SIP semiconductor device 100, the first chip 130 controls power supply to the second chip 110. Hence, the second chip 110 cannot manage the power supplied thereto. As a result, power supply management cannot be flexibly performed in the conventional SIP semiconductor device 100. Moreover, in this case, it is disadvantageous that the second chip 110 only be configured with the memory, hence, a separate interface or a controller is also included in the second chip 110.

In another conventional SIP semiconductor device, each of the first and second chips 130 and 110 includes a controller, a memory, and an interface. However, it has not been disclosed how the first and second chips are respectively power-managed and only a packaging method for connecting signal lines of the first and second chips 130 and 110 has been disclosed.

Therefore, there is a need for an effective power supply management method for an SIP semiconductor device including a plurality of chips each having a controller, a memory, and an interface. Furthermore, for size reduction and low power consumption, it is required that the SIP semiconductor device include the chips and operate by interlocking the chips. Thus, an SIP semiconductor device suitable for effective power management is required.

SUMMARY OF THE INVENTION

The present invention provides a system in package (SIP) semiconductor device that can be efficiently power-managed.

The present invention also provides a method of efficiently managing power of an SIP semiconductor device.

According to an aspect of the present invention, there is provided a system in package (SIP) semiconductor device comprising a plurality of chips including a first chip and a second chip. Each of the chips may include an alive block continuously supplied with power in order to continuously be in an on-state; a local interface transmitting data to the other chips or receiving data from the other chips; and an intellectual property (IP) block individually storing or processing data. The alive blocks of the chips are connected to each other through a first signal line unit for transmitting a signal required to wake up or initialize the chips. The alive blocks control power to the chips, respectively, in response to an external wake-up instruction signal or a signal transmitted through the first signal line unit.

The local interfaces of the chips may be connected to each other through a second signal line unit.

The alive block of the first chip may include a real time clock (RTC) outputting an RTC signal for providing state information by counting a period of the RTC signals. The first signal line unit may connect the alive block of the first chip to the alive blocks of the other chips in a point-to-point manner. The RTC of the first chip may output an RTC signal to the alive blocks of the other chips through first signal lines of the first signal line unit. When an external instruction signal is transmitted to the alive block of the first chip for waking up the chips, the alive block of the first chip may transmit a power-on signal to the alive block of the second chip through a second signal line of the first signal line unit. When the external instruction signal is transmitted to the alive block of the first chip for waking up the chips, the alive block of the first chip may transmit a reset signal to the local interface and other components of the first chip for waking up the first chip. When the alive block of the second chip receives the power-on signal from the alive block of the first chip, the alive block of the second chip may transmit a reset signal to the local interface and other components of the second chip for waking up the second chip. When an external signal or activity for waking up the chips is detected, the alive block of the first chip may generate the power-on signal to control wake-up of the second chip and the other chips. When an external signal or activity for waking up the chips is detected, the alive blocks of the first and second chips may respectively generate the reset signals for waking up the first and second chips. After the alive block of the second chip transmits the reset signal, the alive block of the second chip ma-transmit a wake-up confirmation signal to the alive-block of the first chip through a third signal line of the first signal line unit so as to inform the alive block of the first chip that the second chip has woken up. The first signal line unit ma comprises a plurality of signal lines including a first signal line and the second and third signal line, wherein the RTC of the first chip outputs an RTC signal to the alive blocks of the other chips through the first signal line of the first signal line unit.

In one embodiment, each of the first and second chips comprises a data bus connecting the alive block to the local interface, the alive block to a controller or a memory, and the local interface to the controller or the memory. The IP block of the first chip may comprise a central processing unit (CPU), wherein when the CPU generates a power-down instruction signal, the local interfaces of the first and second chips receive the power-down instruction signal, and the local interface of the second chip manages a power-down operation of the second chip according to the received power-down instruction signal. After generating the power-down instruction signal, the CPU of the first chip may power down components of the first chip except for the alive block of the first chip and enter a power-down mode. The local interface of the second chip may power down components of the second chip except for the alive block of the second chip and enter a power-down mode in response to the power-down instruction signal. Each of the IP blocks of the chips may comprise a CPU, wherein when the CPU generates a power-down instruction signal, components of the chip except for the alive block of the chip are powered down in response to the power-down instruction signal.

In one embodiment, the data transmitted through the local interface of each of the chips are generated from the IP block and comprises content data or state data indicating an operational state of the chip.

In one embodiment, the first signal line unit receives a power-on-reset signal from out of the chip, and transmits the external power-on-reset signal to the alive blocks of the chips. When the power-on-reset signal is transmitted to the alive blocks of the chips, the local interfaces and the IP blocks of the chips may be supplied with power and initialized. The alive block of the first chip may transmit the power-on-reset signal to the local interface and the IP block of the first chip, and the alive block of the second chip may transmit the power-on-reset signal to the local interface and the IP block of the second chip. The local interface and the IP block of the first chip may be initialized in response to the power-on-reset signal, and the local interface and the IP block of the second chip may be initialized in response to the power-on-reset signal. The local interfaces of the first and second chips may transmit state data that having information about a process of initialization to each other through the second signal line unit.

According to another aspect of the present invention, there is provided a method of managing power of a system in package (SIP) semiconductor device including a plurality of chips including a first chip and a second chip, the method including: continuously supplying power to alive blocks of the chips; when the chips are requested by an external wake-up source to be woken up or initialized, transmitting wake-up or initialization information to the alive blocks of the chips; and managing power of other components of the chips in response to management of the alive blocks.

The method may further include transmitting data between one of the chips and the other chips using local interfaces of the chips to exchange data generated from the chips when the chips are in a wake-up state.

In one embodiment, the method further comprises: generating a power-down instruction signal using a central processing unit (CPU) included in the first chip; and operating the chips in a power-down mode by interrupting power to the components of the chips except for the alive blocks of the chips in response to the power-down instruction signal. Generating of the power-down instruction signal may comprises: transmitting the power-down instruction signal to components of the first chip except for the alive block of the first chip; transmitting the power-down instruction signal from the local interface of the first chip to the local interfaces of the other chips; and transmitting the power-down instruction signals from the local interfaces of the other chips to other components of the other chips. Operating the chips in the power-down mode may comprises: operating the first chip in the power-down mode by interrupting power to the components of the first chip except for the alive block of the first chip; operating the other chips in the power-down mode by interrupting power to the components of the other chips except for the alive blocks of the other chips; and operating the CPU of the first chip and the local interfaces of the other chips in the power-down mode.

Transmitting of the wake-up or initialization information to the alive blocks of the chips may comprise transmitting the wake-up or initialization information from the external wake-up source to the alive blocks of the chips, and managing of the power of other components of the chips may comprise controlling the alive blocks of the chips to power up and initialize other components the chips. Transmitting the data between one of the chips and the other chips may comprises: initializing the components of the chips in response to the alive blocks of the chips; and transmitting state data having information about a progress of initialization from one of the chips to the other chips using the local interfaces of the chips.

Transmitting of the wake-up or initialization information may comprises: operating a real time clock (RTC) of the alive block of the first chip; obtaining state information by counting a RTC signal generated from the RTC; determining whether the chips are requested by an external wake-up source to be woken up or initialized by using the state information.

Transmitting of the wake-up or initialization information may include: when the first chip receives the wake-up or initialization information, transmitting a power-on signal from the first chip to the alive blocks of the other chips to wake up or initialize the other chips; and transmitting wake-up signal confirming that the other chips are woken up or initialized from the alive blocks of the other chips to the alive block of the first chip in response to the power-on signal. Managing the power of other components of the chips may comprise: when the first chip receives the wake-up or initialization information, transmitting a reset signal from the alive block of the first chip to other components of the first chip; and supplying power to the components of the first chip. Transmitting of the wake-up signal may comprise: when a power-on signal is transmitted from the first chip to the alive blocks of the other chips, transmitting reset signals from the alive blocks of the other chips to other components of the other chips; supplying power to the components of the other chips; and transmitting the wake-up signal from the alive blocks of the other chips to the alive block of the first chip to inform the first chip that the other chips are woken up or initialized. The reset signals may be generated when a signal or activity for waking up the chips is detected, and the components of the chips other than the alive blocks are supplied with power for wake-up or initialization according to the reset signals.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
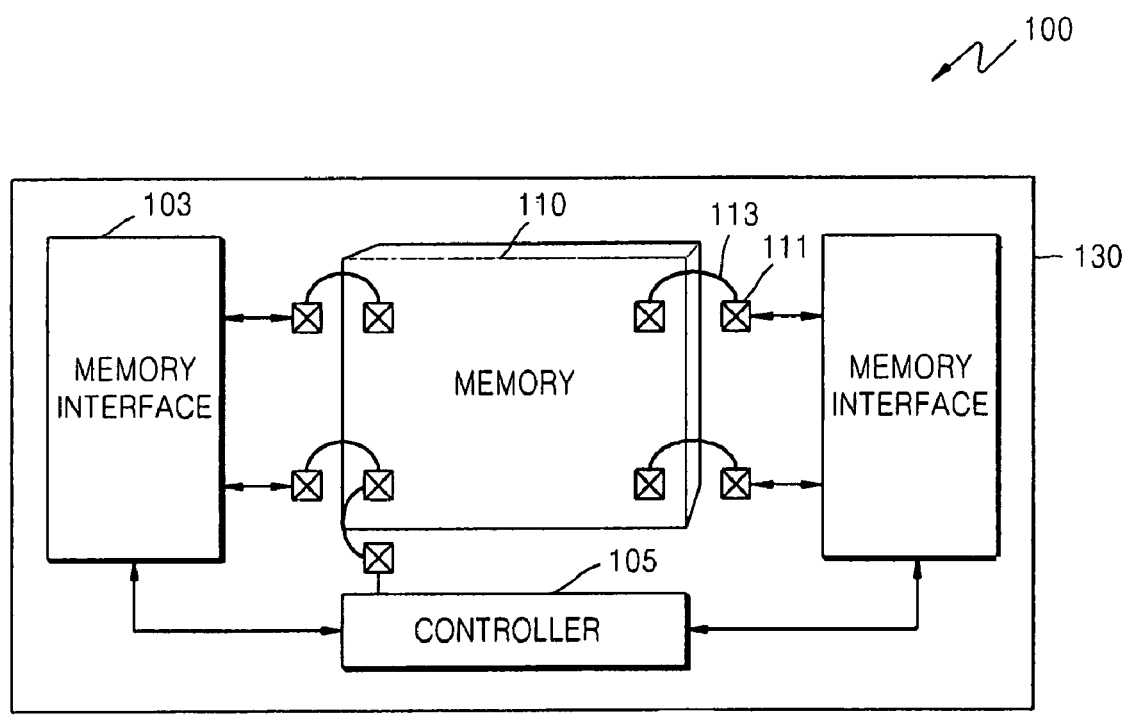
FIG. 1 illustrates a conventional system in package (SIP) semiconductor device.
Figure 2A:
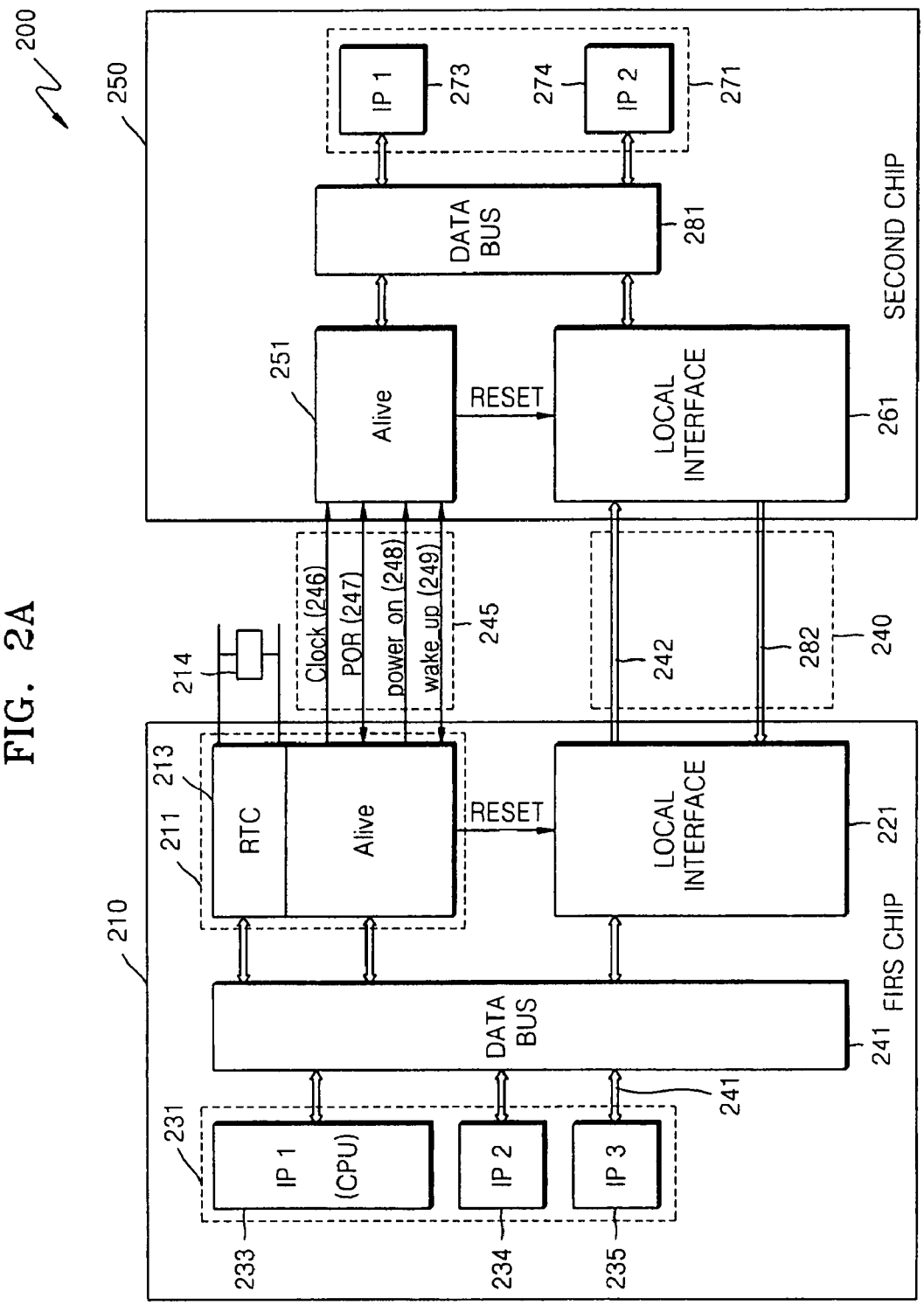
FIG. 2A illustrates an SIP semiconductor device according to an embodiment of the present invention.

FIG. 2A illustrates a system in package (SIP) semiconductor device 200 according to an embodiment of the present invention. The SIP semiconductor device 200 includes a plurality of chips, and, for example, the SIP semiconductor device 200 of the current embodiment includes a first chip 210 and a second chip 250.

The first chip 210 includes an alive block 211, a local interface 221, and an intellectual property (IP) block 231 that are electrically connected to one another through a data bus 241 for transmission of signals and data.

Power is continuously supplied to the alive block 211 to keep the alive block 211 in a wake-up state at all times. For example, in a semiconductor device used in a cellular phone terminal, essential components such as alive blocks of chips are always turned on, and the alive blocks are connected to one another through signal line units. Hence, in the SIP semiconductor device 200 of the current embodiment, the alive block 211 of the first chip 210 is connected to an alive block 251 of the second chip 250 through a first signal line unit 245.

The alive block 211 of the first chip 210 is connected to the alive block 251 of the second chip 250 by a point-to-point method or other connection method. Hence, in the point-to-point method, the first chip 210 (a central chip) is directly connected to other chips such as the second chip 250. In another connection method, the first chip 210 can be connected to the second chip 250, the second chip 250 can be connected to a third chip (not shown), and the third chip can be connected to a fourth chip (not shown), for example. Such methods of connecting one chip to other chips are apparent to one of ordinary skill in the related art, and thus, a detailed description will be omitted.

A real time clock (RTC) 213 is included in the alive block 211 of the first chip 210 to provide actual time information. Since the RTC 213 must provide time information continuously, power is supplied to the RTC 213 continuously and the RTC 213 may operate using a crystal 214 (also called a frequency oscillator), which is a precise frequency generator that is used to generate a precise RTC signal.

The RTC 213 generates an RTC signal to provide information about the current time, and the RTC signal is regularly monitored or counted to determine whether a system using the SIP semiconductor device 200 is normally operating. For example, in a cellular phone system, it is regularly checked whether there is an incoming call or it is time for alarm by using the RTC signal generated from the RTC 213. When the SIP semiconductor device 200 includes a plurality of chips and the RTC 213 is included in only one of the chips (e.g., the first chip 210), an RTC signal is transmitted to the other chips from the first chip 210 through a first line 246 of the first signal line unit 245.

Local interfaces 221 and 261 respectively of the first and second chips 210 and 250 are general-purpose interface blocks used for data transmission between chips. The local interfaces 221 and 261 respectively of the first and second chips 210 and 250 are connected to each other through a second signal line unit 240. If the first and second chips 210 and 250 include separate local interfaces, respectively, interference between signals of the first and second chips 210 and 250 can be reduced.

Data transmitted between the local interfaces 221 and 261 respectively of the first and second chips 210 and 250 may include state data and content data. The state data may include information about instructions and operational states of the first and second chips 210 and 250 or other components. Hence, the state data can be transmitted in the form of a state-notification signal or a state information request signal. The content data may be data stored in a memory or output data obtained by processing the data stored in the memory.

Local interfaces of a plurality of chips can be connected through a data bus such as a bus interconnect. In FIG. 2A, the local interfaces 221 and 261 respectively of the first and second chips 210 and 250 are connected through data buses 242 and 282 of the second signal line unit 240.

The data buses 242 or 282 are data transmission paths that are well known to one of ordinary skill in the related art, and thus, detailed descriptions of the data buses 242 and 282 will be omitted.

The IP block 231 is a functional block (a semiconductor module) that is included in a semiconductor integrated circuit (IC) and is designed to have individual functions and be reusable. Hence, the IP block 231 provides functions required for a semiconductor logic circuit and is formed in the form of hardware or software.

The IP block 231 includes a plurality of memories or processors. In the current embodiment illustrated in FIG. 2A, the IP block 231 includes an IP1 module 233, an IP2 module 234, and an IP3 module 235. Each of the IP1 module 233, IP2 module 234, and IP3 module 235 can be a central processing unit (CPU), a memory, a memory controller, or an image processor processing image data. If necessary, the IP1 module 233, the IP2 module 234, and the IP3 module 235 can be individually included in the SIP semiconductor device 200 instead of being included in the IP block 231 as a module.

In the current embodiment illustrated in FIG. 2A, the IP block 231 of the first chip 210 includes a CPU as the IP1 module 233; however, an IP block 271 of the second chip 250 does not include a CPU as an IP1 module 273.

Figure 2B:
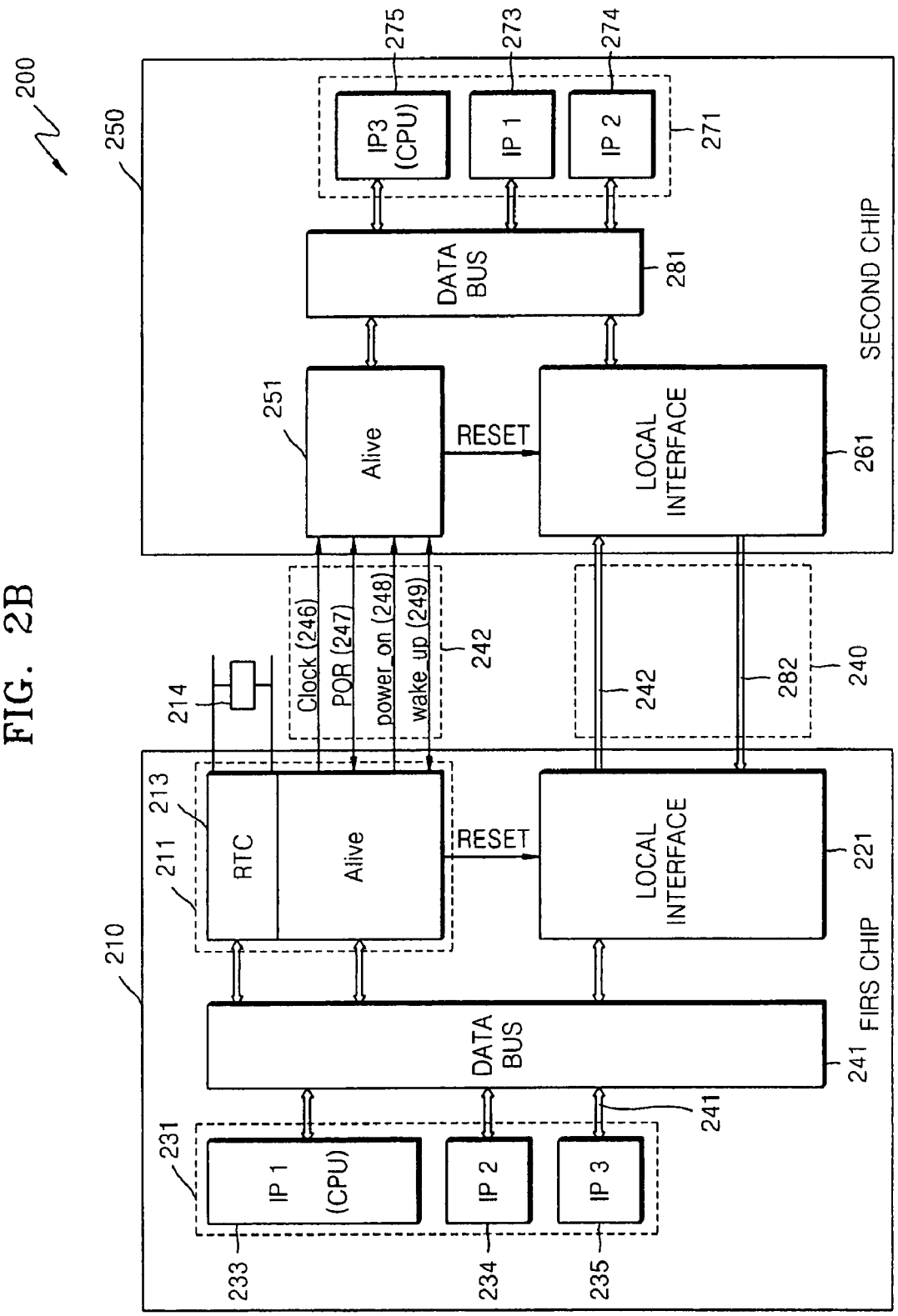
FIG. 2B illustrates an SIP semiconductor device according to another embodiment of the present invention;.

FIG. 2B illustrates the SIP semiconductor device 200 according to another embodiment of the present invention.

Referring to FIG. 2B, in the SIP semiconductor device 200 of the current embodiment, the IP block 271 of the second chip 250 includes a CPU as an IP3 module 275 as opposed to the SIP semiconductor device 200 of the previous embodiment of FIG. 2A.

Figure 3:
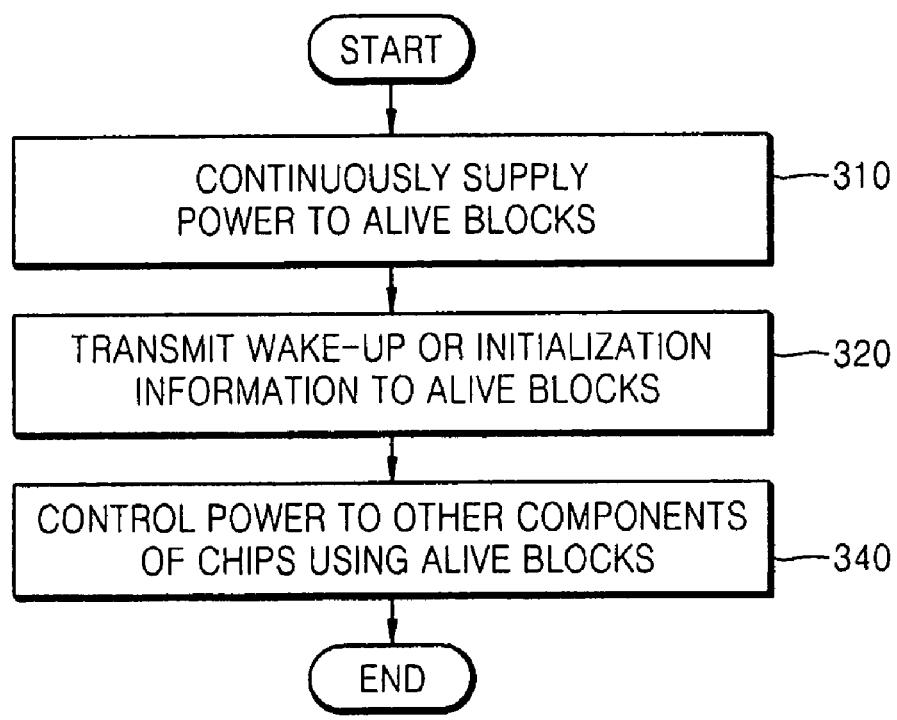
FIG. 3 is a flowchart of a method of managing power of an SIP semiconductor device according to an embodiment of the present invention.

FIG. 3 is a flowchart of a method of managing power of the SIP semiconductor device 200, according to an embodiment of the present invention. The power management method of the current embodiment will now be described with reference to FIGS. 3 and 2A.

Referring to FIG. 3, the power management method may start with operation 310 where power is continuously supplied to the alive blocks 211 and 251 respectively of the first and second chips 210 and 250.

In operation 320, wake-up information or initialization information is transmitted to the alive blocks 211 and 251 respectively of the first chips 210 and 250. For example, a semiconductor device of a mobile communication terminal may operate in a power-down mode when the mobile communication terminal is not in use, a wake-up mode when the mobile communication terminal is in use, and a reset mode when the mobile communication terminal is initialized. In the power-down mode, power is not supplied to all the components of the SIP semiconductor device 200, such as the local interfaces 221 and 261, the IP blocks 231 and 271, and data buses 241 and 281, except for the alive blocks 211 and 251 respectively of the first chips 210 and 250.

In the wake-up mode, power is supplied to all the components of the SIP semiconductor device 200 to wake up the SIP semiconductor device 200 for use. In the reset mode, all data required for operation of the SIP semiconductor device 200 are initialized.

Since the alive blocks 211 and 251 are continuously supplied with power by being turned on at all times, the alive blocks 211 and 251 can receive a wake-up signal from an external wake-up source even in the power-down mode. In addition, the alive blocks 211 and 251 can generate a power-on-reset signal and share the power-on-reset signal with each other through a first signal line 247 of the first signal line unit 245.

In operation 340, the alive blocks 211 and 251 control power to be supplied to other components of the SIP semiconductor device 200. Hence, after the alive blocks 211 and 251 receive wake-up information or initialization information, the alive blocks 211 and 251 communicate with each other through the first signal line unit 245, and then control power to be supplied to other components of the SIP semiconductor device 200.

The wake-up, power-down, and reset modes of the SIP semiconductor device 200, and a method of managing power of the SIP semiconductor device 200 according to the modes will now be described with reference to FIGS. 4A, 4B, and 4C.

Figure 4A:
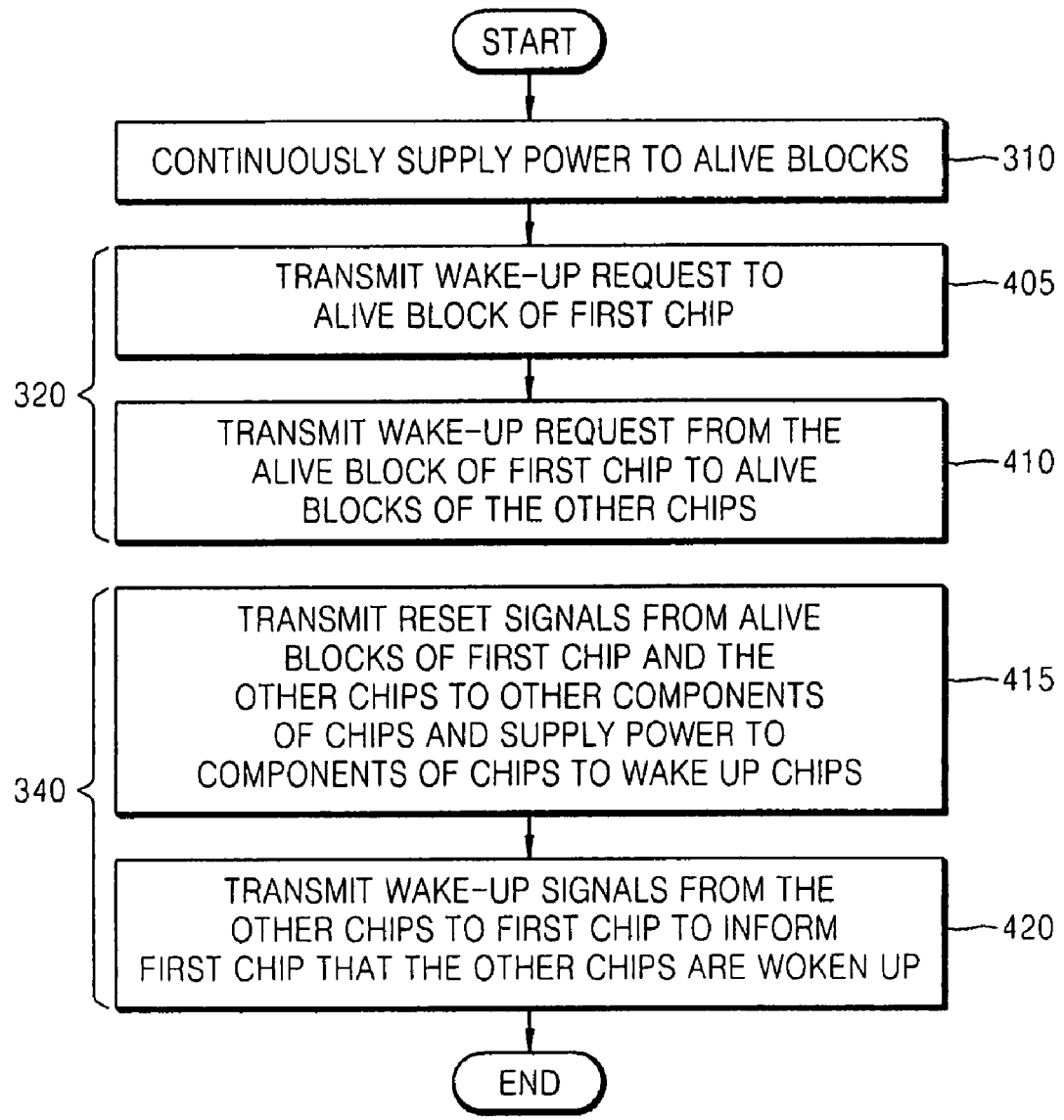
FIG. 4A is a flowchart of the method of FIG. 3 in a wake-up mode, according to an embodiment of the present invention.

FIG. 4A is a flowchart specifically illustrating the method of FIG. 3 in the wake-up mode, according to an embodiment of the present invention. The method of managing power of the SIP semiconductor device 200 in the wake-up mode will now be described with reference to FIGS. 2A and 4A, according to an embodiment of the present invention.

Referring to FIGS. 2A and 4A, power is continuously supplied to the alive blocks 211 and 251 respectively of the first chips 210 and 250 in operation 310.

In operation 405, a wake-up request by the SIP semiconductor device 200 (e.g., wake-up of a plurality of chips included in the SIP semiconductor device 200) is transmitted to the alive block 211 of the first chip 210. The alive block 211 can recognize the wake-up request by detecting activity of an external wake-up source. For example, when a user presses a button (a wake-up source) of a portable terminal, a wake-up request can be transmitted to the alive block 211 of the first chip 210. A wake-up request can be transmitted from a wake-up source to one of a plurality of chips included in an SIP semiconductor device. In the current embodiment, the wake-up request is transmitted to the first chip 210 of the SIP semiconductor device 200.

If the alive block 211 recognizes activity of the wake-up source in operation 405, the alive block 211 wakes up. Here, the term "wake-up" is used to denote a wake-up (activation) operation of a chip from a power-down state.

In operation 410, the alive block 211 of the first chip 210 transmits a power-on signal 248 through the first signal line unit 245 to the alive block 251 of the second chip 250 in order to wake up the second chip 250. In the present embodiment, the power-on signal 248 of the alive block 211 can be transmitted through the first signal line unit 245.

In operation 415, the alive blocks 211 and 251 respectively of the first and second chips 210 and 250 transmit reset signals to essential components of the first and second chips 210 and 250, respectively. In the present embodiment, the essential components of the first and second chips 210 and 250 are components necessary for activation of the first and second chips 210 and 250. Hence, the essential components may be the local interfaces 221 and 261 that are used for data transmission between the first and second chips 210 and 250, the data buses 241 and 281 (data transmission paths), and controllers (not shown) of the IP blocks 231 and 271 that are used for controlling operations of the first and second chips 210 and 250, respectively. For example, the reset signals may be transmitted to the local interfaces 221 and 261 respectively of the first and second chips 210 and 250, and at least one of the IP blocks 231 and 271.

In the first chip 210, the alive block 211 can transmit the reset signal to the local interface 221 and the IP block 231 through the data bus 241. In the second chip 250, the alive block 251 can transmit the reset signal to the local interface 261 and the IP block 271 through the data bus 281.

Furthermore, in operation 415, the alive blocks 211 and 251 respectively of the first and second chips 210 and 250 control the essential components (e.g., the local interfaces 221 and 261 and the IP blocks 231 and 271) to which the reset signals are transmitted, so that the essential components of the first and second chips 210 and 250 are supplied with power for wake up. If the first and second chips 210 and 250 wake up, the local interfaces 221 and 261 exchange state data with each other to recognize an operational state of the other party.

If the alive block 251 of the second chip 250 receives the power-on signal 248 from the alive block 211 of the first chip 210, the alive block 251 transmits a wake-up confirmation signal 249 to the alive block 211 through the first signal line unit 245 to inform the alive block 211 of the wake-up of the second chip 250 in operation 420.

In the current embodiment, the first chip 210 recognizes an activity of a wake-up source. However, the second chip 250 or other chips can also recognize the activity of a wake-up source in the same manner as the first chip 210.

As described above, according to the method of FIG. 4A, when chips of an SIP semiconductor device are activated in a wake-up mode, power supply to essential components of the chips is managed using alive blocks of the chips that are connected to each other and thus, power supply and management can be efficiently performed.

Figure 4B:
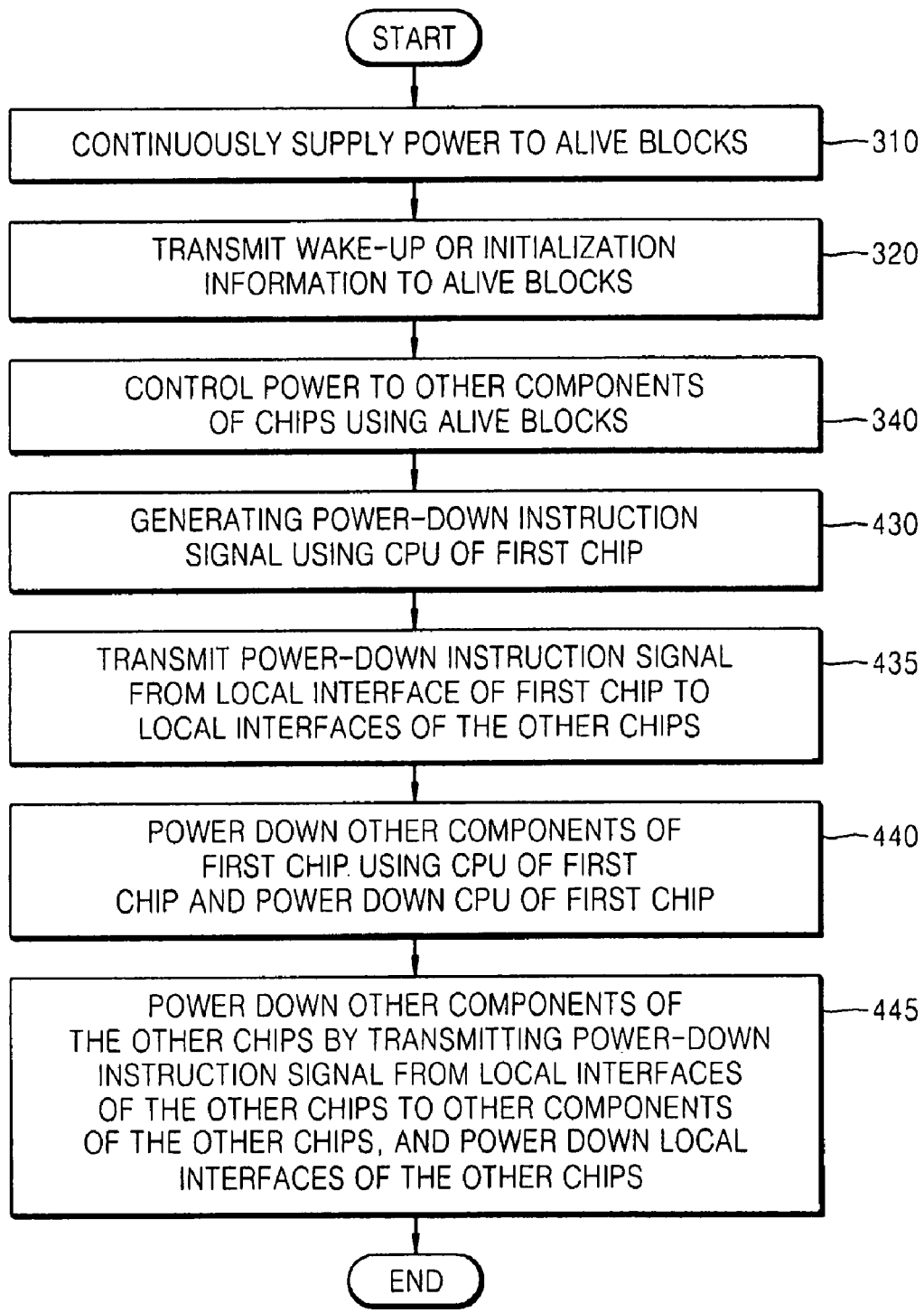
FIG. 4B is a flowchart of the method of FIG. 3 in a power-down mode, according to an embodiment of the present invention.

FIG. 4B is a flowchart of the method of FIG. 3 in the power-down mode, according to an embodiment of the present invention. The method of managing power of the SIP semiconductor device 200 in the power-down mode will now be described together with how the SIP semiconductor device 200 operates in the power-down mode with reference to FIGS. 2A and 4B, according to an embodiment of the present invention.

As described above, in the power-down mode, power is not supplied to the first and second chips 210 and 250 of the SIP semiconductor device 200, and the first and second chips 210 and 250 stay in a non-activated state. Since the operations 310, 320, and 340 in FIG. 3 have already been described, detailed descriptions thereof will not be repeated.

Referring to FIGS. 2A and 4B, in the current embodiment, the method of managing power of the SIP semiconductor device 200 in the power-down mode is described in the case where the IP block 231 of the first chip 210 includes the IP1 module 233 (hereinafter referred to as 'CPU 233'), and the IP block 271 of the second chip 250 does not include a CPU as one of its IP1 and IP2 modules 273 and 274.

In operation 430, the CUP 233 of the first chip 210 outputs a power-down instruction signal. That is, a power-down operation is controlled by the CPU 233 of the first chip 210. For example, the power-down instruction signal can be automatically output if a user does not manipulate a portable terminal including the SIP semiconductor device 200 for a predetermined time.

In the first chip 210, the power-down instruction signal is transmitted from the CPU 233 to the local interface 221 through the data bus 241. In operation 435, the local interface 221 of the first chip 210 transmits the power-down instruction signal to the local interface 261 of the second chip 250 through the second signal line unit 240. The local interface 261 of the second chip 250 is informed of the operational state (power-down mode) of the first chip 210 through the power-down instruction signal (state data).

In the first chip 210, the CPU 233 powers down other components such as the local interface 221 and the IP block 231 except for the alive block 211, and the CPU 233 enters the power-down mode in operation 440. Hence, the CPU 233 interrupts power to the local interface 221 and the IP block 231.

In the second chip 250, the local interface 261 turns off components such as the IP block 271 except for the alive block 251 by interrupting power to the components in response to the power-down instruction signal received from the first chip 210, and the local interface 261 enters power-down mode by interrupting power of the local interface 261 and the other components such as the IP block 271 in operation 445.

In the method of managing power of the SIP semiconductor device 200 according the current embodiment of the present invention, the power-down instruction signal is transmitted from the first chip 210 to the second chip 250, through the second signal line unit 240, and the CPU 233 of the first chip 210 manages the components of the first chip 210 in the power-down mode. In addition, in the power-down mode, the CPU 233 of the first chip 210 manages the components of the second chip 250 that does not include a CPU by using the local interfaces 221 and 261 respectively of the first chip 210 and second chip 250. Therefore, power can be efficiently interrupted in the power-down mode.

If chips of an SIP semiconductor device include CPUs, respectively, the chips can be managed using their CPUs, respectively, in the power-down mode. For example, in the case of the SIP semiconductor device 200 of FIG. 2B, the CPU 233 of the first chip 210 interrupts power to components of the first chip 210, and the CPU 275 of the second chip 250 interrupts power to components of the second chip 250 in the power-down mode, respectively.

Figure 4C:
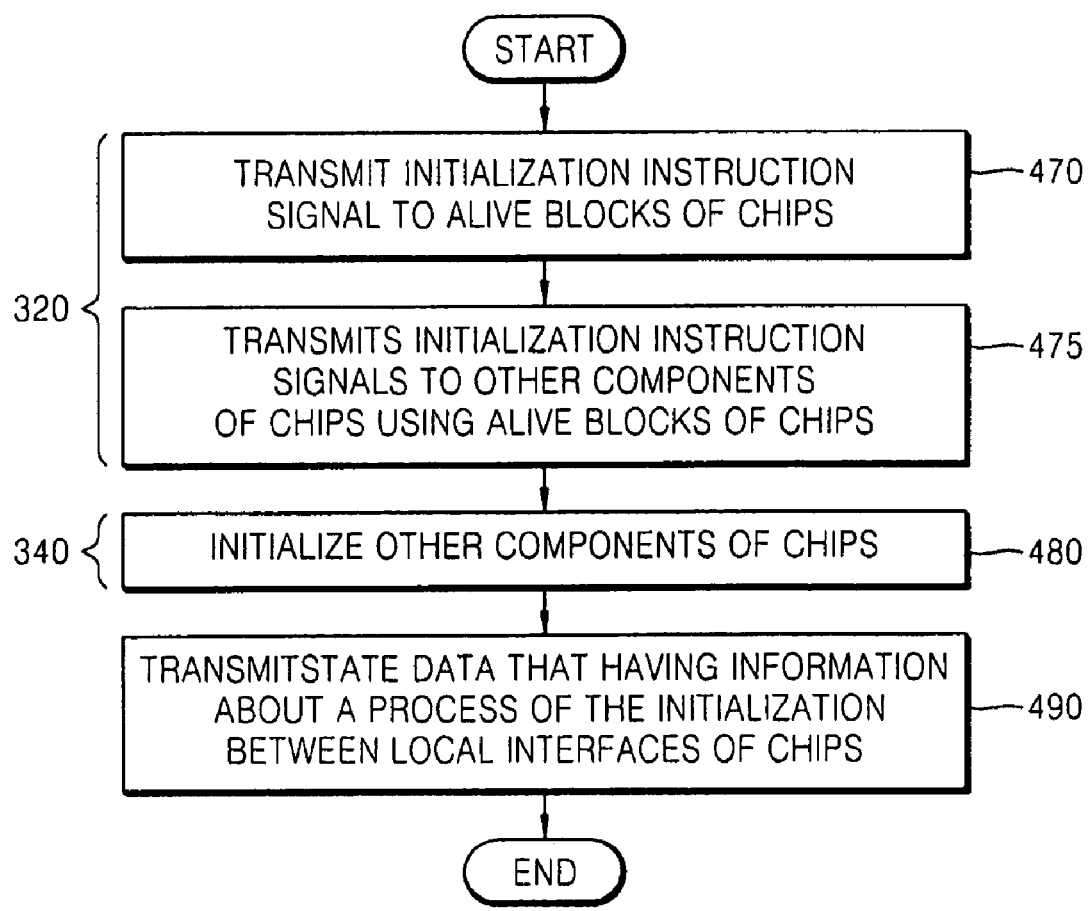
FIG. 4C is a flowchart of the method of FIG. 3 in a power-on-reset mode, according to an embodiment of the present invention.

FIG. 4C is a flowchart of the method of FIG. 3 in a power-on-reset mode, according to an embodiment of the present invention. The method of managing power of the SIP semiconductor device 200 in the power-on-reset mode will now be described together with how the SIP semiconductor device 200 operates in the power-on-reset mode with reference to FIGS. 4C and 2A according to an embodiment of the present invention. Even if operation 310 of the method of FIG. 3 is not included in the flowchart of the method of FIG. 4C, operation 310 can be included in the flowchart.

Referring to FIGS. 2A and 4C, an initialization instruction signal is input to the alive blocks 211 and 251 respectively of the first and second chips 210 and 250 in operation 470. For example, the initialization instruction signal may be input to the alive blocks 211 and 251 when a portable terminal with the SIP semiconductor device 200 is turned on. The initialization instruction signal is input through the first signal line 247 of the first signal line unit 245 as a power-on-reset signal. In an SIP semiconductor device with a plurality of chips, the power-on-reset signal can be input to all the chips of the SIP semiconductor device through the first signal line 247.

Then, the alive blocks 211 and 251 transmit reset signals to other components of the first and second chips 210 and 250 such as the local interfaces 221 and 261 and the IP blocks 231 and 271 in operation 475. The components of the first and second chips 210 and 250 are initialized by the reset signals of the alive blocks 211 and 251. In detail, the alive block 211 of the first chip 210 transmits the reset signal to the interface 221 and the IP block 231, and the alive block 251 of the second chip 250 transmits the reset signal to the local interface 261 and the IP block 271. If the reset signals are transmitted to the components of the first and second chips 210, power is also supplied to the components of the first and second chips 210.

In operation 480, the components of the first and second chips 210 and 250 are initialized in response to the reset signals.

In operation 490, the local interfaces 221 and 261 of the first and second chips 210 and 250 exchange initialization state information with each other through the second signal line unit 240 to provide information about an initialization state to the other party.

As described above, in the SIP semiconductor device, power is supplied to each component of chips of the SIP semiconductor device using the alive block or the local interface included in each chip, according to an embodiment of the present invention, and thus, power can be efficiently managed.

In the method of managing power of the SIP semiconductor device, power is supplied to each component using the alive block or the local interface included in each chip, according to an embodiment of the present invention, and thus, power can be efficiently managed.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A system in package (SIP) semiconductor device comprising a plurality of chips including a first chip and a second chip,
wherein each of the chips includes:
an alive block continuously supplied with power in order to continuously be in an on-state;
a local interface transmitting data to the other chips or receiving data from the other chips; and
an intellectual property (IP) block individually storing or processing data,
wherein the alive blocks of the chips are connected to each other through a first signal line unit for transmitting a signal required to wake up or initialize the chips, and the alive blocks control power to the chips, respectively, in response to an external wake-up instruction signal or a signal transmitted through the first signal line unit,
wherein the local interfaces of the chips are connected to each other through a second signal line unit;
wherein the alive block of the first chip comprises a real time clock (RTC) outputting an RTC signal for providing state information by counting a period of the RTC signals; and wherein when an external instruction signal is transmitted to the alive block of the first chip for waking up the chips, the alive block of the first chip transmits a power-on signal to the alive block of the second chip through a second signal line of the first signal line unit.

2. The SIP semiconductor device of claim 1, wherein the first signal line unit connects the alive block of the first chip to the alive blocks of the other chips in a point-to-point manner.

3. The SIP semiconductor device of claim 1, wherein the RTC of the first chip outputs an RTC signal to the alive blocks of the other chips through first signal lines of the first signal line unit.

4. The SIP semiconductor device of claim 1, wherein when the external instruction signal is transmitted to the alive block of the first chip for waking up the chips, the alive block of the first chip transmits a reset signal to the local interface and other components of the first chip for waking up the first chip.

5. The SIP semiconductor device of claim 4, wherein when the alive block of the second chip receives the power-on signal from the alive block of the first chip, the alive block of the second chip transmits a reset signal to the local interface and other components of the second chip for waking up the second chip.

6. The SIP semiconductor device of claim 5, wherein when an external signal or activity for waking up the chips is detected, the alive block of the first chip generates the power-on signal to control wake-up of the second chip and the other chips.

7. The SIP semiconductor device of claim 5, wherein when an external signal or activity for waking up the chips is detected, the alive blocks of the first and second chips respectively generate the reset signals for waking up the first and second chips.

8. The SIP semiconductor device of claim 5, wherein after the alive block of the second chip transmits the reset signal, the alive block of the second chip transmits a wake-up confirmation signal to the alive block of the first chip through a third signal line of the first signal line unit so as to inform the alive block of the first chip that the second chip has woken up.

9. The SIP semiconductor device of claim 8, wherein the first signal line unit comprises a plurality of signal lines including a first signal line and the second and third signal line,
wherein the RTC of the first chip outputs an RTC signal to the alive blocks of the other chips through the first signal line of the first signal line unit.

10. The SIP semiconductor device of claim 1, wherein each of the first and second chips comprises a data bus connecting the alive block to the local interface, the alive block to a controller or a memory, and the local interface to the controller or the memory.

11. The SIP semiconductor device of claim 10, wherein the IP block of the first chip comprises a central processing unit (CPU),
wherein when the CPU generates a power-down instruction signal, the local interfaces of the first and second chips receive the power-down instruction signal, and the local interface of the second chip manages a power-down operation of the second chip according to the received power-down instruction signal.

12. The SIP semiconductor device of claim 11, wherein after generating the power-down instruction signal, the CPU of the first chip powers down components of the first chip except for the alive block of the first chip and enters a power-down mode.

13. The SIP semiconductor device of claim 12, wherein the local interface of the second chip powers down components of the second chip except for the alive block of the second chip and enters a power-down mode in response to the power-down instruction signal.

14. The SIP semiconductor device of claim 10, wherein each of the IP blocks of the chips comprises a CPU,
wherein when the CPU generates a power-down instruction signal, components of the chip except for the alive block of the chip are powered down in response to the power-down instruction signal.

15. The SIP semiconductor device of claim 1, wherein the data transmitted through the local interface of each of the chips are generated from the IP block and comprises content data or state data indicating an operational state of the chip.

16. The SIP semiconductor device of claim 1, wherein the first signal line unit receives a power-on-reset signal from out of the chip, and transmits the external power-on-reset signal to the alive blocks of the chips.

17. The SIP semiconductor device of claim 16, wherein when the power-on-reset signal is transmitted to the alive blocks of the chips, the local interfaces and the IP blocks of the chips are supplied with power and are initialized.

18. The SIP semiconductor device of claim 17, wherein the alive block of the first chip transmits the power-on-reset signal to the local interface and the IP block of the first chip, and the alive block of the second chip transmits the power-on-reset signal to the local interface and the IP block of the second chip.

19. The SIP semiconductor device of claim 18, wherein the local interface and the IP block of the first chip are initialized in response to the power-on-reset signal, and the local interface and the IP block of the second chip are initialized in response to the power-on-reset signal.

20. The SIP semiconductor device of claim 19, wherein the local interfaces of the first and second chips transmit state data that having information about a process of initialization to each other through the second signal line unit.

21. A method of managing power of a system in package (SIP) semiconductor device including a plurality of chips including a first chip and a second chip, the method comprising:
continuously supplying power to alive blocks of the chips;
when the chips are requested by an external wake-up source to be woken up or initialized, transmitting wake-up or initialization information to the alive blocks of the chips;
managing power of other components of the chips in response to management of the alive blocks; and
transmitting data between one of the chips and the other chips using local interfaces of the chip to exchange data generated from the chip when the chip are in a wake-up state;
wherein the transmitting of the wake-up or initialization information to the alive blocks of the chips comprises transmitting the wake-up or initialization information from the external wake-up source to the alive blocks of the chips;
wherein the managing of the power of other components of the chips comprises controlling the alive blocks of the chips to power up and initialize other components of the chips;
wherein the transmitting of the data between one of the chips and the other chips comprises:
initializing the components of the chips in response to the alive blocks of the chips; and
transmitting state data having information about a progress of initialization from one of the chips to the other chips using the local interfaces of the chips.

22. The method of claim 21, further comprising:
generating a power-down instruction signal using a central processing unit (CPU) included in the first chip; and
operating the chips in a power-down mode by interrupting power to the components of the chips except for the alive blocks of the chips in response to the power-down instruction signal.

23. The method of claim 22, wherein the generating of the power-down instruction signal comprises:
transmitting the power-down instruction signal to components of the first chip except for the alive block of the first chip;
transmitting the power-down instruction signal from the local interface of the first chip to the local interfaces of the other chips; and
transmitting the power-down instruction signals from the local interfaces of the other chips to other components of the other chips.

24. The method of claim 23, wherein the operating of the chips in the power-down mode comprises:
operating the first chip in the power-down mode by interrupting power to the components of the first chip except for the alive block of the first chip;
operating the other chips in the power-down mode by interrupting power to the components of the other chips except for the alive blocks of the other chips; and
operating the CPU of the first chip and the local interfaces of the other chips in the power-down mode.

25. The method of claim 21, wherein the transmitting of the wake-up or initialization information comprises:
operating a real time clock (RTC) of the alive block of the first chip;
obtaining state information by counting a RTC signal generated from the RTC;
determining whether the chips are requested by an external wake-up source to be woken up or initialized by using the state information.

26. The method of claim 21, wherein the transmitting of the wake-up or initialization information comprises:
when the first chip receives the wake-up or initialization information, transmitting a power-on signal from the first chip to the alive blocks of the other chips to wake up or initialize the other chips; and
transmitting wake-up signal confirming that the other chips are woken up or initialized from the alive blocks of the other chips to the alive block of the first chip in response to the power-on signal.

27. The method of claim 26, wherein the managing of the power of other components of the chips comprises:
when the first chip receives the wake-up or initialization information, transmitting a reset signal from the alive block of the first chip to other components of the first chip; and
supplying power to the components of the first chip.

28. The method of claim 27, wherein the transmitting of the wake-up signal comprises:
when a power-on signal is transmitted from the first chip to the alive blocks of the other chips, transmitting reset signals from the alive blocks of the other chips to other components of the other chips;
supplying power to the components of the other chips; and
transmitting the wake-up signal from the alive blocks of the other chips to the alive block of the first chip to inform the first chip that the other chips are woken up or initialized.

29. The method of claim 28, wherein the reset signals are generated when a signal or activity for waking up the chips is detected, and the components of the chips other than the alive blocks are supplied with power for wake-up or initialization according to the reset signals.

30. A system in package (SIP) semiconductor device comprising a plurality of chips including a first chip and a second chip,
wherein each of the chips includes:
an alive block continuously supplied with power in order to continuously be in an on-state;
a local interface transmitting data to the other chips or receiving data from the other chips; and
an intellectual property (IP) block individually storing or processing data,
wherein the alive blocks of the chips are connected to each other through a first signal line unit for transmitting a signal required to wake up or initialize the chips, and the alive blocks control power to the chips, respectively, in response to an external wake-up instruction signal or a signal transmitted through the first signal line unit,
wherein the local interfaces of the chips are connected to each other through a second signal line unit;
wherein the alive block of the first chip comprises a real time clock (RTC) outputting an RTC signal for providing state information by counting a period of the RTC signals;
wherein the first signal line unit connects the alive block of the first chip to the alive blocks of the other chips in a point-to-point manner; and
wherein the RTC of the first chip outputs an RTC signal to the alive blocks of the other chips through first signal lines of the first signal line unit.

31. A system in package (SIP) semiconductor device comprising a plurality of chips including a first chip and a second chip,
wherein each of the chips includes:
an alive block continuously supplied with power in order to continuously be in an on-state;
a local interface transmitting data to the other chips or receiving data from the other chips; and
an intellectual property (IP) block individually storing or processing data,
wherein the alive blocks of the chips are connected to each other through a first signal line unit for transmitting a signal required to wake up or initialize the chips, and the alive blocks control power to the chips, respectively, in response to an external wake-up instruction signal or a signal transmitted through the first signal line unit;
wherein the local interfaces of the chips are connected to each other through a second signal line unit;
wherein the first signal line unit receives a power-on-reset signal from out of the chip, and transmits the external power-on-reset signal to the alive blocks of the chips;
wherein when the power-on-reset signal is transmitted to the alive blocks of the chips, the local interfaces and the IP blocks of the chips are supplied with power and are initialized;
wherein the alive block of the first chip transmits the power-on-reset signal to the local interface and the IP block of the first chip, and the alive block of the second chip transmits the power-on-reset signal to the local interface and the IP block of the second chip;
wherein the local interface and the IP block of the first chip are initialized in response to the power-on-reset signal, and the local interface and the IP block of the second chip are initialized in response to the power-on-reset signal; and wherein the local interfaces of the first and second chips transmit state data that having information about a process of initialization to each other through the second signal line unit.

32. A method of managing power of a system in package (SIP) semiconductor device including a plurality of chips including a first chip and a second chip, the method comprising:

continuously supplying power to alive blocks of the chips wherein the alive blocks of the chips are connected to each other through a first signal line unit;

when the chips are requested by an external wake-up source to be woken up or initialized, transmitting wake-up or initialization information to the alive blocks of the chips using a second signal line of the first signal line unit; and managing power of other components of the chips in response to management of the alive blocks, wherein the transmitting of the wake-up or initialization information comprises:

when the first chip receives the wake-up or initialization information, transmitting a power-on signal from the first chip to the alive blocks of the other chips to wake up or initialize the other chips; and transmitting wake-up signal confirming that the other chips are woken up or initialized from the alive blocks of the other chips to the alive block of the first chip in response to the power-on signal using a third signal line of the first signal line unit.

33. The method of claim 32, wherein the managing of the power of other components of the chips comprises:

when the first chip receives the wake-up or initialization information, transmitting a reset signal from the alive block of the first chip to other components of the first chip; and supplying power to the components of the first chip.

34. The method of claim 33, wherein the transmitting of the wake-up signal comprises:

when a power-on signal is transmitted from the first chip to the alive blocks of the other chips, transmitting reset signals from the alive blocks of the other chips to other components of the other chips;

supplying power to the components of the other chips; and transmitting the wake-up signal from the alive blocks of the other chips to the alive block of the first chip to inform the first chip that the other chips are woken up or initialized.

35. The method of claim 34, wherein the reset signals are generated when a signal or activity for waking up the chips is detected, and the components of the chips other than the alive blocks are supplied with power for wake-up or initialization according to the reset signals.

* * * * *